US012777668B2

(12) United States Patent
Ganagona et al.

(10) Patent No.: US 12,777,668 B2
(45) Date of Patent: Oct. 27, 2026

(54) EPITAXIAL FIELD STOP REGION FOR SEMICONDUCTOR DEVICES

(71) Applicant: SEMICONDUCTOR COMPONENTS INDUSTRIES, LLC, Phoenix, AZ (US)

(72) Inventors: Naveen Ganagona, Fishkill, NY (US); George Chang, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 944 days.

(21) Appl. No.: 17/804,460

(22) Filed: May 27, 2022

(65) Prior Publication Data

US 2023/0049926 A1 Feb. 16, 2023

Related U.S. Application Data

(60) Provisional application No. 63/260,239, filed on Aug. 13, 2021.

(51) Int. Cl.

| | |
|---|---|
| ***H10D 12/00*** | (2025.01) |
| ***H10D 8/00*** | (2025.01) |
| ***H10D 62/17*** | (2025.01) |
| ***H10P 30/20*** | (2026.01) |
| ***H10P 32/10*** | (2026.01) |
| ***H10P 32/12*** | (2026.01) |

(52) U.S. Cl.

CPC ......... *H10D 12/441* (2025.01); *H10D 62/393* (2025.01); *H10P 30/20* (2026.01); *H10P 32/12* (2026.01); *H10P 32/171* (2026.01); *H10D 8/00* (2025.01)

(58) Field of Classification Search

None

See application file for complete search history.

(56) References Cited

U.S. PATENT DOCUMENTS

| | | | | |
|---|---|---|---|---|
| 5,329,144 | A | 7/1994 | Luryi | |
| 6,737,722 | B2 | 5/2004 | Yamamoto et al. | |
| 7,084,456 | B2 | 8/2006 | Williams et al. | |
| 8,673,700 | B2 | 3/2014 | Yedinak et al. | |
| 9,647,070 | B2 | 5/2017 | Rao | |
| 10,109,719 | B2 | 10/2018 | Lee et al. | |
| 10,707,321 | B2 | 7/2020 | Lee et al. | |
| 2006/0221651 | A1* | 10/2006 | Lee ...................... | H03K 17/162 363/21.02 |
| 2007/0015308 | A1 | 1/2007 | Shenoy et al. | |

(Continued)

FOREIGN PATENT DOCUMENTS

| | | | |
|---|---|---|---|
| DE | 102014106594 | A1 | 11/2015 |
| JP | 2010147366 | A | 7/2010 |

(Continued)

*Primary Examiner* — Sue A Purvis
*Assistant Examiner* — Jordan M Klein
(74) *Attorney, Agent, or Firm* — Brake Hughes Bellermann LLP

(57) ABSTRACT

A semiconductor device includes a backside contact and a substrate. An epitaxial field stop region may be formed on the substrate with a graded doping profile that decreases with distance away from the substrate, and an epitaxial drift region may be formed adjacent to the epitaxial field stop region. A frontside device may be formed on the epitaxial drift region.

15 Claims, 8 Drawing Sheets

(56) References Cited

U.S. PATENT DOCUMENTS

| | | | | |
|---|---|---|---|---|
| 2017/0317075 | A1 | 11/2017 | Arai et al. | |
| 2019/0006461 | A1* | 1/2019 | Zhang | H10D 62/60 |
| 2019/0088745 | A1 | 3/2019 | Xue et al. | |
| 2020/0194550 | A1* | 6/2020 | Baburske | H10D 12/481 |
| 2021/0242340 | A1* | 8/2021 | Siemieniec | H10D 30/0297 |
| 2022/0013368 | A1* | 1/2022 | Agata | H10D 62/109 |
| 2022/0181472 | A1* | 6/2022 | Kato | H10D 12/481 |
| 2022/0216055 | A1* | 7/2022 | Kubouchi | H10D 30/021 |

FOREIGN PATENT DOCUMENTS

| | | | |
|---|---|---|---|
| JP | 2013018659 | A | 1/2013 |
| KR | 20150136490 | A | 12/2015 |

* cited by examiner

EPITAXIAL FIELD STOP REGION FOR SEMICONDUCTOR DEVICES

CROSS-REFERENCE TO RELATED APPLICATIONS

This application claims the benefit of U.S. Provisional Patent Application 63/260,239, filed on Aug. 13, 2021, entitled "FIELD STOP OPTIMIZATION FOR HIGH POWER SEMICONDUCTORS", the entire content of which is incorporated herein by reference in its entirety.

TECHNICAL FIELD

This description relates to semiconductor devices.

BACKGROUND

Semiconductor devices may be required in various types of high power scenarios, such as in electric vehicle or solar power scenarios. Such semiconductor devices may have various types of operational and/or manufacturing constraints. For example, in addition to providing high power levels, such semiconductor devices may be required to provide fast switching, low power loss, high levels of reliability (e.g., avoid overheating), and cost-effective manufacturing.

SUMMARY

According to one general aspect, a semiconductor device may include a backside contact, a substrate adjacent to the backside contact, and an epitaxial field stop region formed on the substrate and having a graded doping profile that decreases with distance away from the substrate. The semiconductor device may include an epitaxial drift region adjacent to the epitaxial field stop region, and a frontside device formed on the epitaxial drift region.

According to another general aspect, a semiconductor device may include a backside contact and a substrate adjacent to the backside contact and having a doping of a first conductivity type. The semiconductor device may include an epitaxial field stop region formed on the substrate and having a graded doping profile of a second conductivity type that decreases with distance away from the substrate, an epitaxial drift region adjacent to the epitaxial field stop region and having a substantially uniform doping profile of the second conductivity type, and a frontside device formed on the epitaxial drift region.

According to another general aspect, a method of making a semiconductor device may include performing at least one epitaxial growth process on a substrate to obtain an epitaxial field stop region on the substrate and an epitaxial drift region on the epitaxial field stop region. The method may also include performing frontside processing to form at least one frontside device on the epitaxial drift region.

The details of one or more implementations are set forth in the accompanying drawings and the description below. Other features will be apparent from the description and drawings, and from the claims.

DETAILED DESCRIPTION

Figure 1:
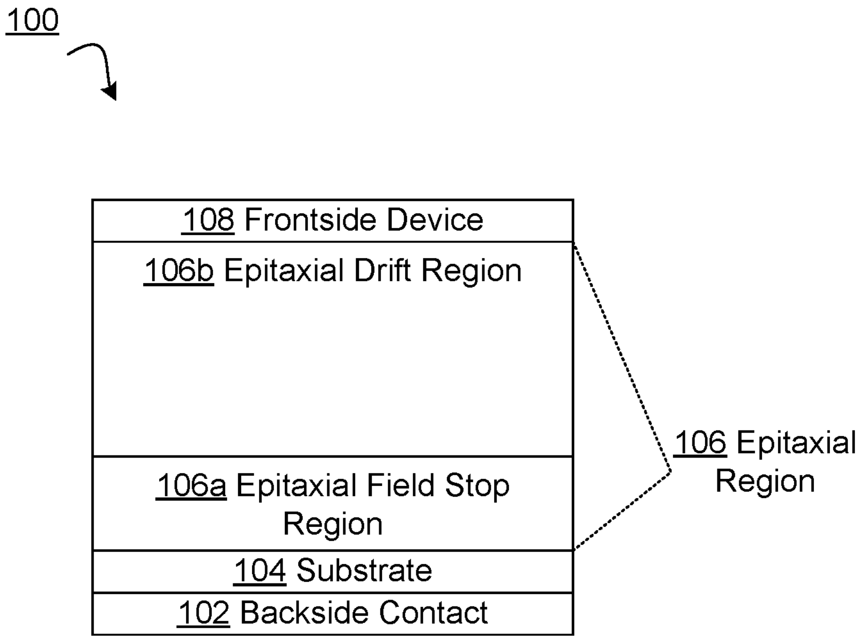
FIG. 1 is a simplified view of a semiconductor device with an epitaxial field stop region.

Many high power semiconductor devices utilize a drift region that is designed, for example, to facilitate a desired breakdown voltage of a device by blocking a high off-state electric field of the device, or otherwise managing off-state behavior of the device(s). Although providing these and other advantages, such drift regions also exhibit a number of disadvantages, as well.

For example, a drift region exhibits a specific on-resistance ($R_{on\_sp}$) that inhibits desired on-behavior of corresponding devices. It is possible to lower $R_{on\_sp}$ by altering physical characteristics of the drift region (e.g., a size or doping profile thereof) or the device(s) (e.g., decreasing a device channel length) but doing so may lead directly to other design difficulties, such as an overall larger device, increased device capacitances, or reduction of the desired advantages of the drift region (such as breakdown voltage control).

To facilitate these and other device constraints, some devices include a field stop layer, e.g., adjacent to the drift region and distal from a device region. The field stop layer in such a device may be more heavily doped than a lightly-doped drift region, and may cause the off-state electric field of the device to fall off abruptly upon reaching the field stop layer.

In conventional field stop devices, however, it is difficult and expensive to attempt to form such field stop layers in a desired manner. For example, conventional field stop layers may be doped using ion implantation processes, which are typically high-energy, high-cost processes.

To facilitate ion implantation, thinned wafers may be used. However, using thinned wafers exacerbates manufacturing costs, because, e.g., more expensive wafer handling tools are required, and thinned wafers are more likely to be lost to manufacturing defects, such as warping and breaking.

Additionally, ion implantation is often performed using high energy proton implantation, which, as referenced above, is an expensive process, requiring specialized equipment and quantities of dedicated space within a manufacturing facility. As semiconductor manufacturing moves towards larger wafer sizes, e.g., from 200 mm to 300 mm, even larger, higher-energy implant machines are required, so that high energy proton implantation becomes even more expensive.

Further, even if such equipment is available, such high-energy ion implantation results in an irregular doping profile, e.g., with peaks and valleys of doping concentrations within the resulting field stop layer. Although it may be theoretically possible to diffuse such peaks and valleys through annealing processes, such annealing processes are not available for use in conventional manufacturing scenarios. For example, in conventional manufacturing processes, as referenced above, wafers have already been thinned, and frontside device processing has already been completed, by the time the high-energy proton implantation process is conducted.

As a result, the peaks and valleys of the field stop doping profiles of the types of conventional devices just referenced may reduce an efficacy of the provided field stop layer. For example, a switching speed of a resulting device may be negatively impacted, as discussed below in more detail, e.g., with respect to FIG. 8.

The present disclosure describes an epitaxial field stop region that may be formed prior to, and in conjunction with, an epitaxial drift region, and prior to front-side device processing. That is, described implementations include such an epitaxial field stop region, and do not require use of an implanted substrate portion or layer to provide a field stop region.

The epitaxial field stop region may be formed with a graded doping profile, which facilitates smooth, prompt, and complete blocking of the off-state electric field, while maintaining fast switching speeds. The epitaxial field stop region may be formed prior to wafer thinning, and prior to frontside device processing, so that any desired or necessary annealing processes may be performed in conjunction with such frontside processing, and if needed to obtain a smooth gradation of the doping profile of the epitaxial field stop region.

Thus, the resulting field stop enables smooth and abrupt electric field blocking, as well as breakdown voltage (BV) control. Moreover, the described epitaxial field stop region provides improved switching performance. Further, related manufacturing processes may be performed in an efficient, cost-effective manner.

Additionally, proton implantation may still be performed. However, as described below, described techniques enable use of relatively low-energy, low-expense proton implantation techniques. Resulting implantations may further bolster a field stop effect of the epitaxial field stop layer, while also facilitating and improving an ohmic contact of the device.

In the example of FIG. 1, a semiconductor device 100 is illustrated as including a backside contact 102, a substrate 104 (which may be doped in various manners, as described in more detail, below), an epitaxial region 106, and a frontside device 108. As further illustrated, the epitaxial region 106 includes an epitaxial field stop region 106*a* and an epitaxial drift region 106*b*.

As FIG. 1 is a simplified representation of many different types of semiconductor devices, it will be appreciated that the illustrated components of FIG. 1 may be implemented using various types of materials and/or structures, and are not intended to be drawn to scale. In more detailed or specific implementations of FIG. 1, various layers and components may be disposed in various relations to one another, and various additional or alternative layers or other components, not specifically illustrated in FIG. 1, may be included.

Figure 2:
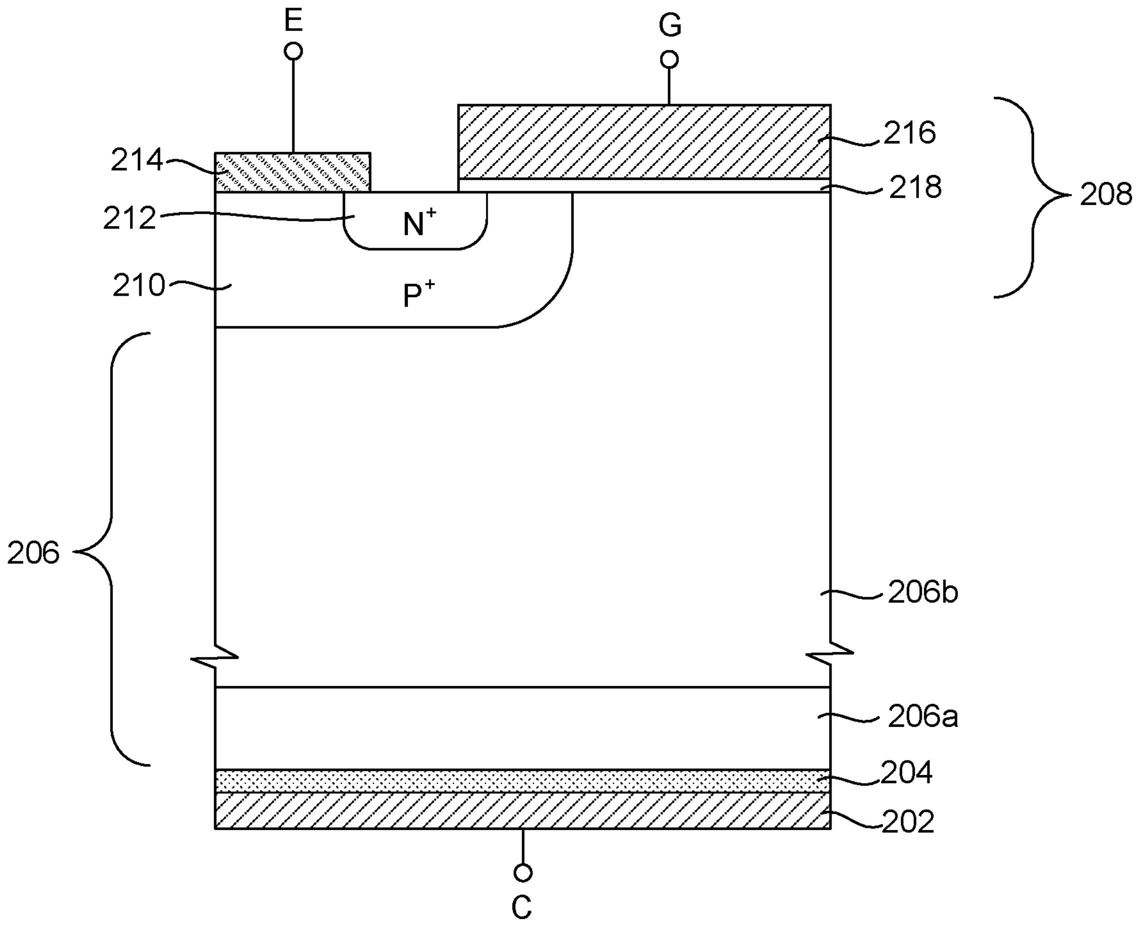
FIG. 2 is a more specific example implementation of the semiconductor device of FIG. 1.

Thus, the semiconductor device of FIG. 1 may represent a number of different types of semiconductor devices. For example, the device of FIG. 1 may represent a Fast Recovery Diode (FRD). In other examples, the device of FIG. 1 may represent various types of transistors. For example, FIG. 2 illustrates a more specific example of a field stop Insulated Gate Bipolar Transistor (IGBT).

Figure 3:
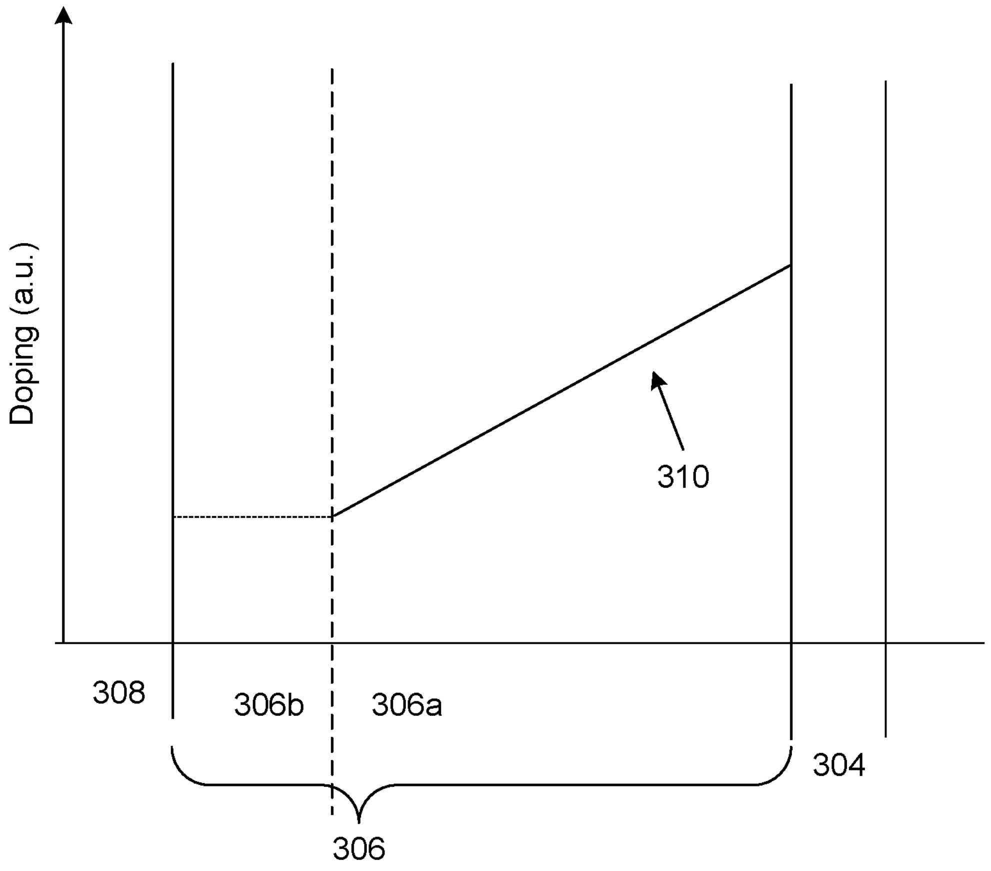
FIG. 3 is a graph illustrating a first example doping profile that may be used in the examples of FIGS. 1 and 2.
Figure 4:
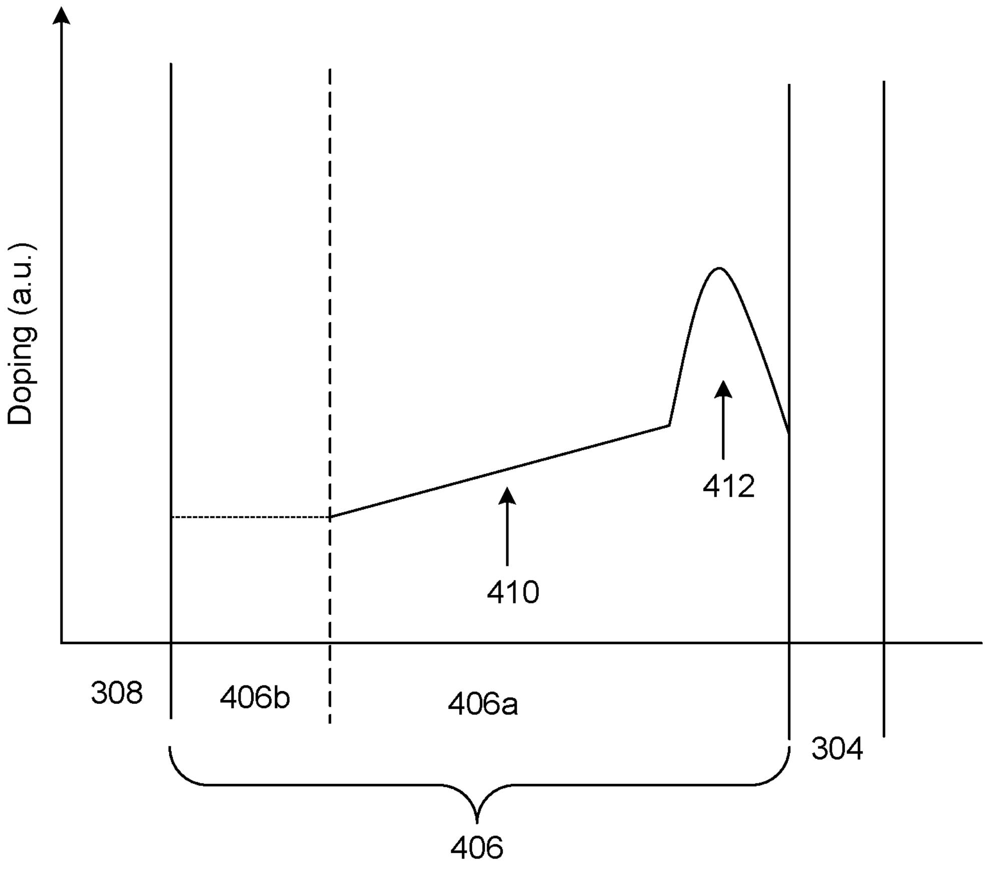
FIG. 4 is a graph illustrating a second example doping profile that may be used in the examples of FIGS. 1 and 2.

In FIG. 1, the epitaxial field stop region 106*a* may be provided with a graded doping profile, as shown in more detail in FIGS. 3 and 4. For example, a doping profile of the epitaxial field stop region 106*a* may increase continuously or linearly through at least a portion of the epitaxial field stop region 106*a*, in a direction from the frontside device 108 towards the substrate 104.

As referenced above, and described in more detail, below, with respect to FIGS. 3-7, multiple techniques may be used to obtain multiple versions of such a graded doping profile. For example, the epitaxial field stop region 106*a* may be grown on the substrate 104 in conjunction with corresponding adjustments to flow rate, temperature, and other parameters needed to result in a graded doping profile.

Figure 5:
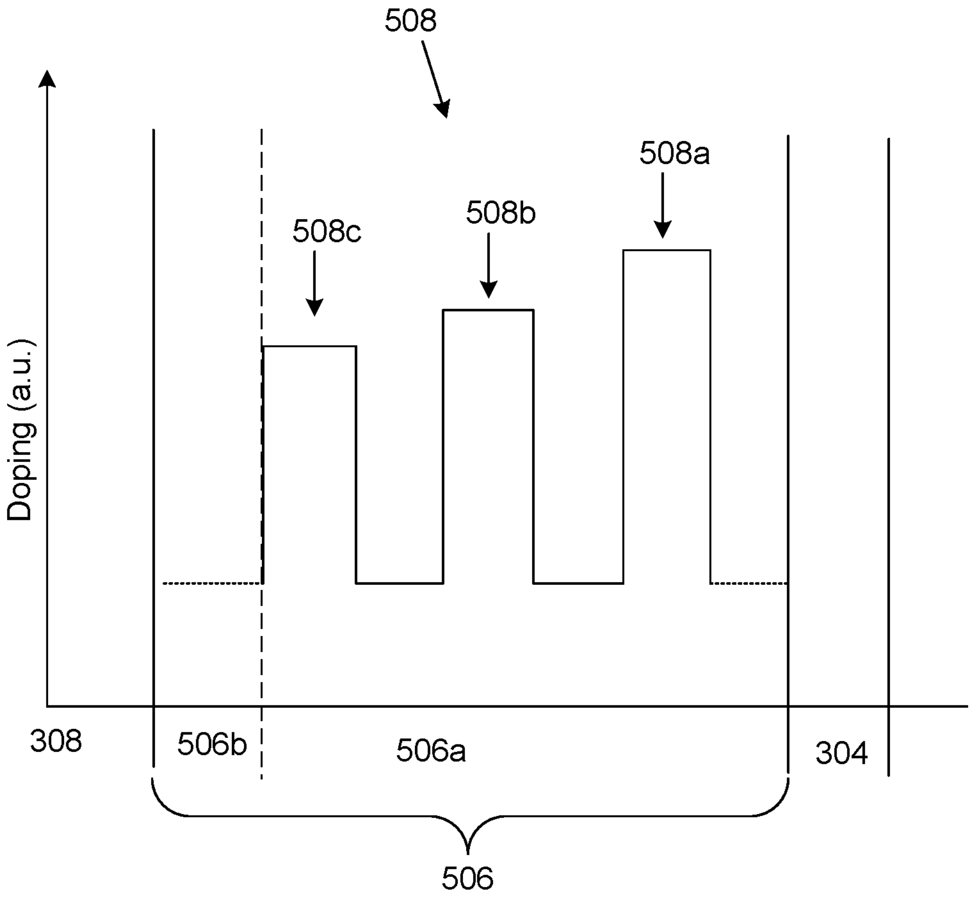
FIG. 5 is a graph illustrating an intermediate doping profile that may be used to obtain the example doping profiles of FIGS. 3 and 4.

In other examples, as described with respect to FIG. 5, the epitaxial field stop region 106*a* may initially be formed using multiple discrete epitaxial/doping steps, resulting in multiple doping peaks. In such implementations, however, subsequent annealing processes, such as may take place during frontside processing of the frontside device 108, may cause a desired dopant diffusion within the epitaxial field stop region 106*a* and result in a smooth, continuous, and/or linear doping profile within the epitaxial field stop region 106*a*. As also described herein, such annealing is facilitated because the epitaxial field stop region 106*a* may be formed prior to a thinning of the substrate 104, and prior to completion of frontside processing of the frontside device 108.

FIG. 2 is a more specific example implementation of the semiconductor device of FIG. 1, in which the frontside device 108 is implemented as a IGBT. The example embodiment of FIG. 2 includes a collector contact 202 and a substrate 204, which functions as a collector. The substrate 204 may be provided using an appropriately-doped Float Zone (FZ) or Magnetic Czochralski (MCZ) substrate.

The example embodiment of FIG. 2 further includes an epitaxial region 206. The epitaxial region 206 includes an epitaxial field stop region 206*a*, and an epitaxial drift region 206*b*. The epitaxial drift region 206*b* may be formed as an $N^-$ epitaxial layer to implement a drift region of the IGBT. As referenced above with respect to FIG. 1, and illustrated in further detail below, e.g., with respect to FIG. 3, the epitaxial field stop region 206*a* may be provided with a graded doping profile that increases continuously, linearly, or smoothly in a direction towards the substrate 204, through at least a portion of the epitaxial field stop region 206*a*.

Further in FIG. 2, a frontside device 208 is illustrated as an IGBT. For example, impurities may be selectively diffused to form a $P^+$ base region 210, and an $N^+$ emitter region 212 may be formed in the $P^+$ base region 210 on a surface region of the $N^-$ epitaxial drift region 206*b*. A gate electrode 216 is formed on a gate insulating layer 218 to provide a control gate. As shown, the resulting control gate is disposed over portions of the $P^+$ base region 210 and the $N^+$ emitter region 212, and on the surface region of the $N^-$ epitaxial drift region 206*b*. The control gate may be used to form a channel that carries control current for turning the device on and off. An emitter electrode 214 is formed in contact with the $P^+$ base region 210 and the $N^+$ emitter region 212.

FIG. 3 illustrates an example doping profile that may be used in the examples of FIGS. 1 and 2. In FIG. 3, a substrate 304 represents an example of the substrate 104 of FIG. 1 or the substrate 204 of FIG. 2. Similarly, a frontside device 308 represents an example of the frontside device 108 of FIG. 1 or the frontside device 208 (IGBT) of FIG. 2.

Similarly, an epitaxial region 306 represents a more detailed example of the epitaxial region 106 of FIG. 1, or the epitaxial region 206 of FIG. 2. Consequently, an epitaxial field stop region 306*a* represents a more detailed example of the epitaxial field stop region 106*a* of FIG. 1, or the epitaxial field stop region 206*a* of FIG. 2. An epitaxial drift region 306*b* represents an example of the epitaxial drift region 106*b* of FIG. 1, or the epitaxial drift region 206*b* of FIG. 2.

As shown, the epitaxial field stop region 306*a* is provided with a graded doping profile 310 that, in the example, increases linearly from the epitaxial drift region 306*b* to the substrate 304, or, put another way, decreases linearly with distance away from the substrate 304 in a direction of the epitaxial drift region 306*b*. In various examples, a slope and maximum doping concentration of the graded doping profile 310 may be adjusted to any desired value(s). As illustrated in FIG. 3, a doping concentration of the epitaxial drift region may be substantially uniform within the epitaxial drift region 306*b*, and may be equal to or less than a lowest doping concentration of the epitaxial field stop region 306*a*.

FIG. 4 illustrates an example implementation in which an epitaxial region 406 includes an epitaxial field stop region 406*a* and an epitaxial drift region 406*b*. As shown, the epitaxial field stop region 406*a* includes a graded doping profile 410, similar to the graded doping profile 310 of FIG. 3, and also includes a proton implant 412 proximate to the substrate 304.

The resulting doping concentration of the epitaxial field stop region 406 may be obtained in a two-step process, as illustrated below with respect to FIGS. 6 and 7. For example, techniques used to produce the graded doping profile 310 of FIG. 3 may be used, followed by an additional proton implantation process to add the proton implant 412.

As noted above, the proton implant 412 may provide additional blocking of the drift region electric field, while also improving ohmic contact properties. Although conventional field stop substrate layers may include proton implants, such proton implants, as noted above, are formed in a substrate and not within an epitaxially-grown region. Moreover, such conventional proton implants require the more expensive, higher-energy processes referenced above, whereas the proton implant 412 may be implemented as a shallow implant, using lower-cost, lower-energy equipment.

FIG. 5 is a graph illustrating an intermediate doping profile that may be used to obtain the example doping profiles of FIGS. 3 and 4. As referenced above, the graded doping profile 310 of FIG. 3 may be obtained using a single-step epitaxial growth process in which various process parameters (e.g., flow rate or temperature) are modulated and adjusted as needed to obtain the resulting graded doping profile 310.

In other example implementations, however, a multi-step epitaxial growth process may be implemented, in which discrete process steps are used to successively form smaller doping peaks 508*a*, 508*b*, 508*c* of a peaked doping profile 508. Such implementations may be easier and more cost-effective to implement than techniques that continuously vary the doping profile during a single epitaxial growth process to obtain a correspondingly continuous graded doping profile.

Then, during subsequent frontside processing of a frontside device 308, the peaked doping profile 508 may undergo annealing processes of the frontside device 308. As a result, within an epitaxial field stop region 506*a* of an epitaxial region 506 that also includes an epitaxial drift region 506*b*, the peaked doping profile 508 may be diffused into the type of continuous, linear, and/or smooth graded doping profile described herein and illustrated in the examples of FIGS. 3 and 4.

In other example implementations, the annealing processes of the frontside device 308 may not fully diffuse the peaked doping profile 508 into a linear doping profile. In such examples, the graded doping profile of the epitaxial field stop region 506*a* may have a stepped decrease with distance away from the substrate 304. Although the widths of the peaks 508*a*, 508*b*, 508*c* are the same or similar in the example of FIG. 5, in various examples, the step widths may be different, as well.

That is, for example, the peaked doping profile 508 may be diffused into the graded doping profile 310 of FIG. 3. In other example implementations, the graded doping profile 410 may be provided and then the proton implant 412 may be added subsequently to obtain the epitaxial field stop region 406*a* of FIG. 4.

Figure 6:
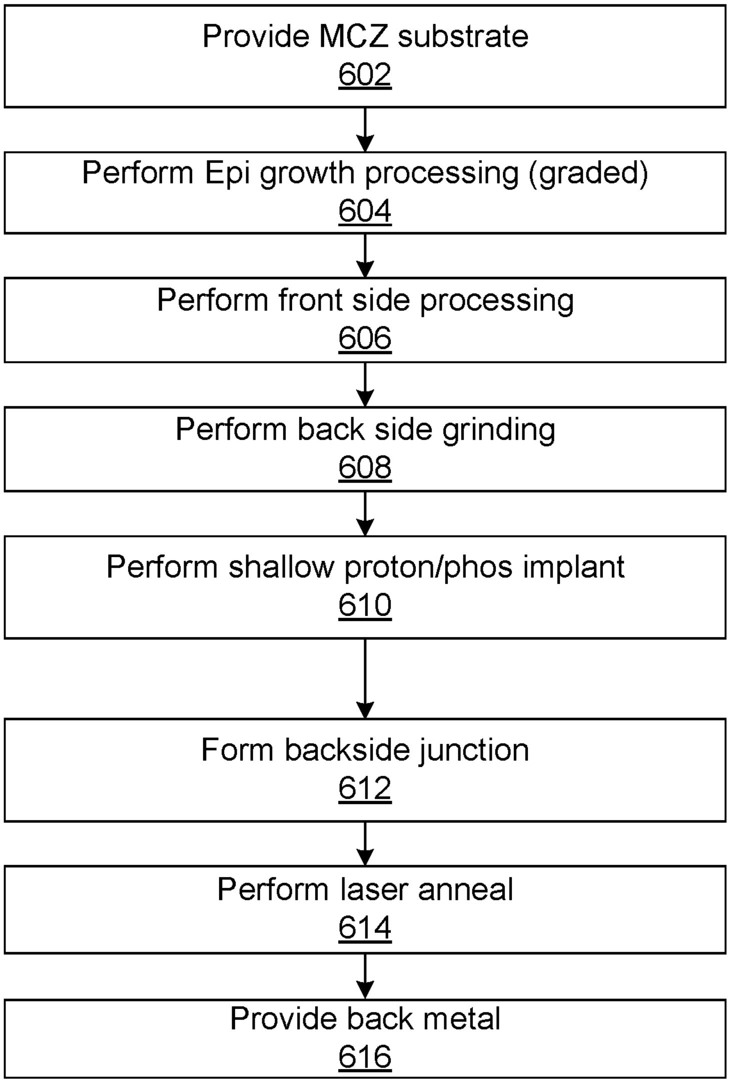
FIG. 6 is a flowchart illustrating a first example manufacturing process for manufacturing the example semiconductor devices of FIGS. 1 and 2.

FIG. 6 is a flowchart illustrating a first example manufacturing process for manufacturing the example semiconductor devices of FIGS. 1 and 2. In the example of FIG. 6, an MCZ substrate is provided (602). For example, the MCZ substrate may be a 300 mm MCZ substrate. As noted above, a FZ substrate or other suitable substrate may be used, as well.

A graded epitaxial growth process may then be performed on the MCZ substrate (604). For example, as referenced above, an epitaxial growth processing recipe may be adjusted while processing is occurring, so that the resulting graded doping profile continuously decreases as the epitaxial field stop region (e.g., the epitaxial field stop region 306*a* of FIG. 3) is grown on the MCZ substrate.

Frontside processing may then be performed (606). For example, the device 208 of FIG. 2, or any suitable device, may be formed. Such frontside processing may include an annealing step, which, as referenced above and described in more detail, below, with respect to FIG. 7, may facilitate diffusion of dopants in a resulting epitaxial field stop region Backside grinding of the MCZ substrate may then be performed (608). For example, the MCZ substrate may be thinned to less than 100 microns, e.g., to 65-75 microns.

In the example of FIG. 6, a shallow proton implant may be performed (610). For example, a proton implant may be performed at energy levels of, e.g., 400 keV or less. In other implementations, other implants may be used, such as phosphorous. In some implementations, as noted above, the shallow proton implant may be omitted.

A backside junction may be formed (612). For example, a backside emitter may be formed from a backside surface of the thinned MCZ substrate. More generally, any suitable or desired backside processing may be executed.

A laser anneal may be performed (614). For example, a laser anneal may be used to complete or optimize the preceding backside processing.

A back metal may then be provided (616). For example, the backside contact 102 of FIG. 1 or the collector contact 202 of FIG. 2 may be provided.

Figure 7:
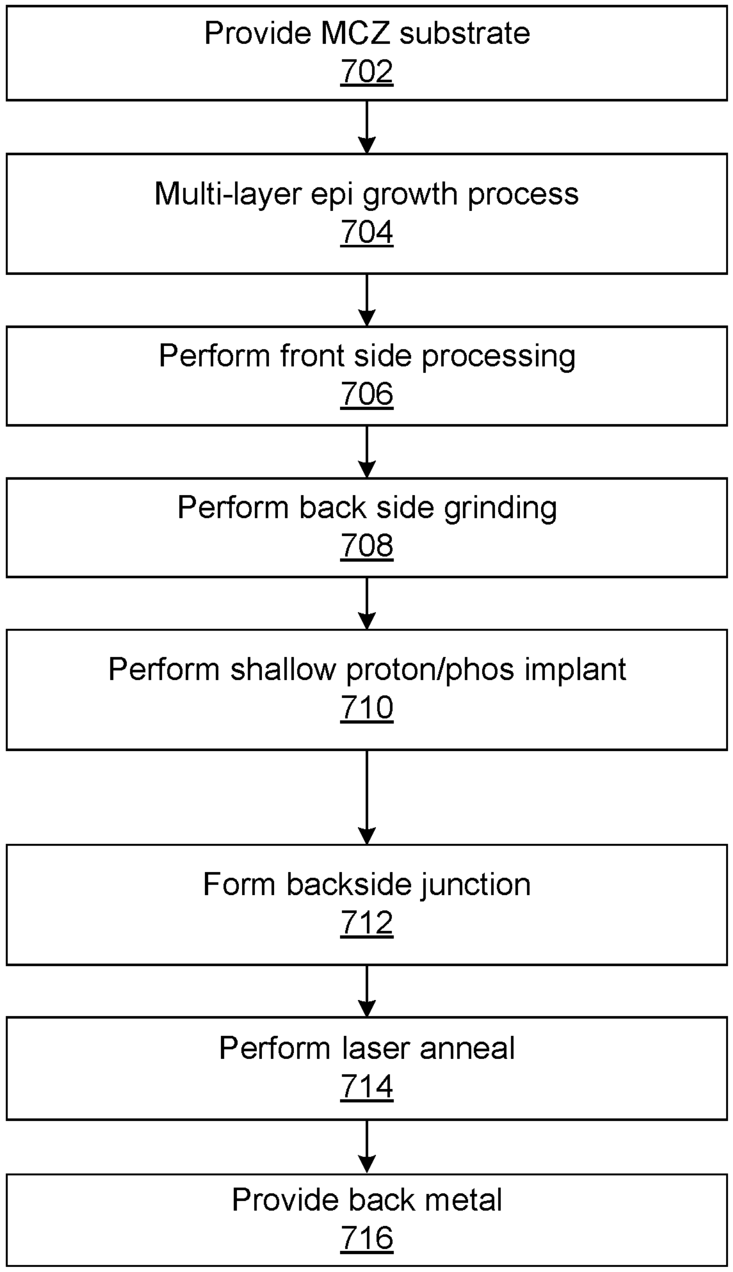
FIG. 7 is a flowchart illustrating a second example manufacturing process for manufacturing the example semiconductor devices of FIGS. 1 and 2.

FIG. 7 is a flowchart illustrating a second example manufacturing process for manufacturing the example semiconductor devices of FIGS. 1 and 2. As shown, FIG. 7 is generally similar to the example of FIG. 6, except that after a providing of the MCZ substrate (702), a multi-layer or multi-step epitaxial growth process may be performed (704), such as illustrated and described above with respect to FIG. 5.

That is, for example, the peaked doping profile 508 of FIG. 5 may be created. As described, such a peaked doping profile may resemble a conventional proton implant profile in existing approaches, but occurs in the example of FIG. 7 within the epitaxial field stop region (e.g., within the epitaxial field stop region 506*a* of FIG. 5, and not as a doped substrate layer) as an intermediate step.

Then, when frontside processing is performed (706), and prior to backside grinding being performed (708), annealing that occurs during the frontside processing may serve to diffuse the peaked doping profile 508 to obtain a continuous, linear, and/or smooth graded profile, such as the graded profile 310 of FIG. 3. In other implementations, following frontside processing, the graded doping profile of the epitaxial field stop region 506*a* may have a stepped decrease with distance away from the substrate Then, if included, a shallow proton implant process may be performed (710). A backside junction may be formed (712), followed by a laser anneal (714). Finally in the example of FIG. 7, a suitable backside metal may be provided (716).

Figure 8:
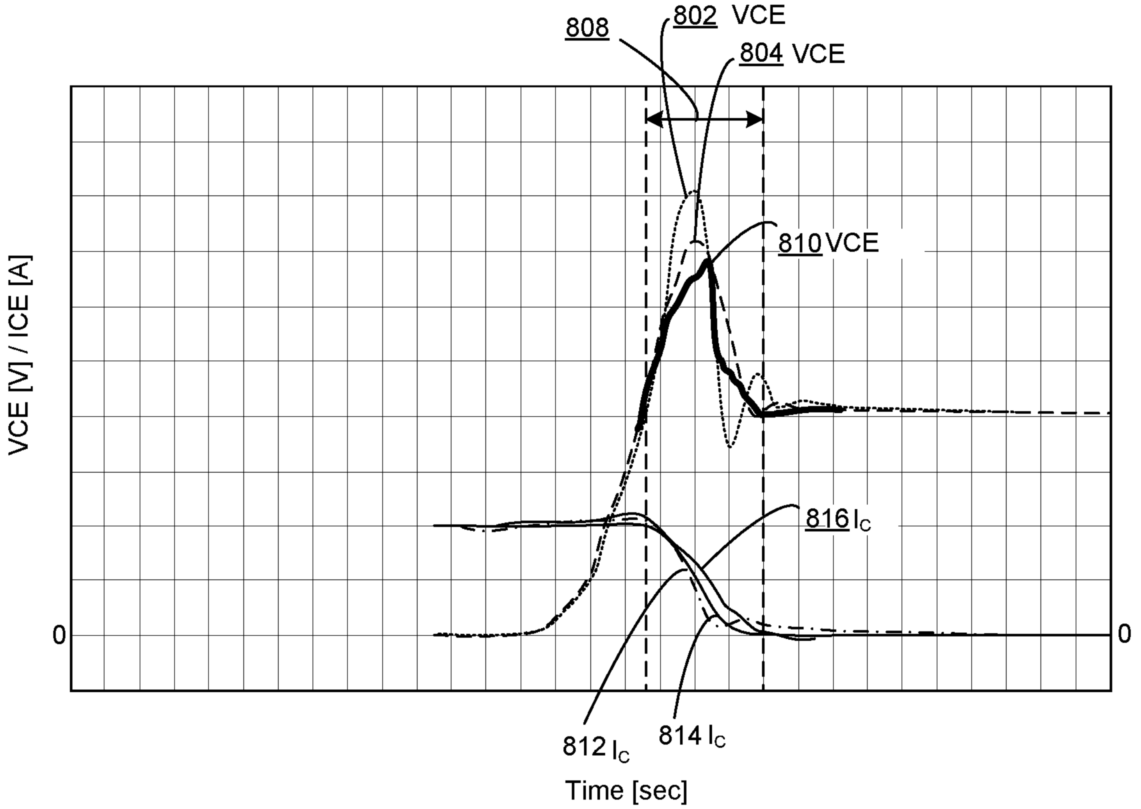
FIG. 8 is an example graph illustrating example collector-emitter voltages and collector currents of example implementations as compared to conventional examples.

FIG. 8 is an example graph illustrating example collector-emitter voltages and collector currents of example implementations as compared to conventional examples. In FIG. 8, a collector-emitter (CE) voltage VCE 802 and a collector-emitter (CE) voltage VCE 804 illustrate a peak voltage that provides an overshoot voltage in conventional devices, and which can lead to switching losses within a time window 808. VCE 810, in accordance with various embodiments described herein, illustrates a lowered peak voltage and corresponding improvements in dv/dt control and improvements in switching.

Similarly, collector currents 812 and 814 correspond to the VCEs 802 and 804 (i.e., within corresponding devices), while collector current 816 illustrates a collector current in accordance with various embodiments described herein. A relatively smoothed IC and correspondingly reduced $dI_C/dt$ of the described embodiments are also correlated with improved switching.

Thus, described techniques enable reduced depletion region expansion and enhanced recombination of carriers outside of a depletion region, thereby reducing Vpeak during turn-off and better dv/dt control. Such carrier recombination outside of a depletion region also provides better dk/dt control when compared to existing approaches. Lower voltage spikes help to avoid dynamic avalanche modes or oscillation issues, leading to improved switching. Described methods can be applied to all suitable high voltage devices and many different high voltage applications, while eliminating a need for high-cost proton implant processes.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A semiconductor device, comprising:

a backside contact; a substrate adjacent to the backside contact;

an epitaxial field stop region formed on the substrate and having a graded doping profile that decreases with distance away from the substrate;

an epitaxial drift region adjacent to the epitaxial field stop region; and a frontside device formed on the epitaxial drift region, wherein the graded doping profile decreases linearly and continuously from a first interface between the substrate and the epitaxial field stop region and a second interface between the epitaxial field stop region and the epitaxial drift region, wherein the epitaxial drift region and the epitaxial field stop region have a doping of a first conductivity type, and the substrate has a doping of a second conductivity type.

2. The semiconductor device of claim 1, wherein the epitaxial drift region has a substantially uniform doping profile.

3. The semiconductor device of claim 1, wherein the epitaxial field stop region includes a proton implant proximal to the substrate.

4. The semiconductor device of claim 1, wherein the frontside device includes an insulated gate bipolar transistor (IGBT).

5. The semiconductor device of claim 1, wherein the frontside device includes fast recovery diode (FRD).

6. A semiconductor device, comprising:

a backside contact;

a substrate adjacent to the backside contact and having a doping of a first conductivity type;

an epitaxial field stop region formed on the substrate and having a graded doping profile of a second conductivity type that decreases with distance away from the substrate;

an epitaxial drift region adjacent to the epitaxial field stop region and having a substantially uniform doping profile of the second conductivity type; and a frontside device formed on the epitaxial drift region, wherein the graded doping profile decreases linearly and continuously from a first interface between the substrate and the epitaxial field stop region and a second interface between the epitaxial field stop region and the epitaxial drift region.

7. The semiconductor device of claim 6, wherein the epitaxial field stop region includes a proton implant proximal to the substrate.

8. A semiconductor device, comprising:

a backside contact;

a substrate adjacent to the backside contact;

an epitaxial field stop region formed on the substrate and having a graded doping profile with a first portion that decreases with distance away from the substrate and a second portion having a proton implant that is between the substrate and the first portion;

an epitaxial drift region adjacent to the epitaxial field stop region; and a frontside device formed on the epitaxial drift region, wherein the graded doping profile decreases linearly and continuously from a first interface between the second portion having the proton implant and the epitaxial field stop region and a second interface between the epitaxial field stop region and the epitaxial drift region.

9. The semiconductor device of claim 8, wherein the epitaxial drift region has a substantially uniform doping profile.

10. The semiconductor device of claim 8, wherein the epitaxial drift region and the epitaxial field stop region have a doping of a first conductivity type, and the substrate has a doping of a second conductivity type.

11. The semiconductor device of claim 8, wherein the frontside device includes an insulated gate bipolar transistor (IGBT).

12. The semiconductor device of claim 8, wherein the frontside device includes fast recovery diode (FRD).

13. The semiconductor device of claim 8, wherein the graded doping profile linearly decreases with distance away from the substrate.

14. The semiconductor device of claim 8, wherein the graded doping profile has a stepped decrease with distance away from the substrate.

15. The semiconductor device of claim 8, wherein a doping concentration of the epitaxial drift region is equal to or less than a lowest doping concentration of the epitaxial field stop region.

* * * * *